(12) United States Patent
Yang et al.

(10) Patent No.: US 8,683,306 B2
(45) Date of Patent: Mar. 25, 2014

(54) SYSTEMS AND METHODS FOR DATA DETECTION INCLUDING DYNAMIC SCALING

(75) Inventors: Shaohua Yang, Santa Clara, CA (US); Weijun Tan, Longmont, CO (US); Zongwang Li, San Jose, CA (US); Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 1086 days.

(21) Appl. No.: 12/651,547

(22) Filed: Jan. 4, 2010

(65) Prior Publication Data

US 2011/0167246 A1 Jul. 7, 2011

(51) Int. Cl.
*H03M 13/03* (2006.01)

(52) U.S. Cl.
USPC .......................................................... 714/796

(58) Field of Classification Search
None
See application file for complete search history.

(56) References Cited

U.S. PATENT DOCUMENTS

| | | | |
|---|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |

(Continued)

FOREIGN PATENT DOCUMENTS

| | | |
|---|---|---|
| WO | WO 2006/016751 | 2/2006 |
| WO | WO 2007091797 | 8/2007 |

OTHER PUBLICATIONS

Casado et al., Multiple-rate low-density parity-check codes with constant blocklength, IEEE Transations on Communications, Jan. 2009, vol. 57, pp. 75-83.

(Continued)

*Primary Examiner* — Robert Fennema
*Assistant Examiner* — Benjamin Geib
(74) *Attorney, Agent, or Firm* — Hamilton DeSanctis & Cha

(57) ABSTRACT

Various embodiments of the present invention provide systems and methods for data processing. For example, a data processing system is disclosed that includes a channel detector circuit. The channel detector circuit includes a branch metric calculator circuit that is operable to receive a number of violated checks from a preceding stage, and to scale an intrinsic branch metric using a scalar selected based at least in part on the number of violated checks to yield a scaled intrinsic branch metric.

20 Claims, 5 Drawing Sheets

(56) References Cited

U.S. PATENT DOCUMENTS

| | | | |
|---|---|---|---|
| 6,671,404 | B1 | 12/2003 | Kawatani et al. |
| 6,748,034 | B2 | 6/2004 | Hattori et al. |
| 6,757,862 | B1 | 6/2004 | Marianetti |
| 6,788,654 | B1 | 9/2004 | Hashimoto et al. |
| 6,810,502 | B2 | 10/2004 | Eidson |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,194,047 | B2 * | 3/2007 | Strolle et al. .................. 375/341 |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 2004/0098659 | A1 | 5/2004 | Bjerke et al. |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song |
| 2006/0195772 | A1 | 8/2006 | Graef et al. |
| 2006/0248435 | A1 | 11/2006 | Haratsch |
| 2007/0011569 | A1 | 1/2007 | Vila Casado et al. |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |
| 2012/0033320 | A1 * | 2/2012 | Tan et al. ........................ 360/39 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC Techron, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

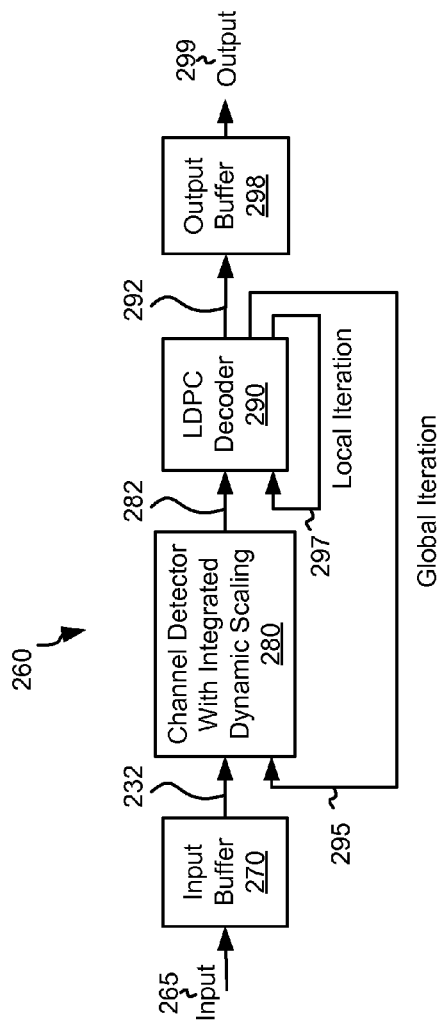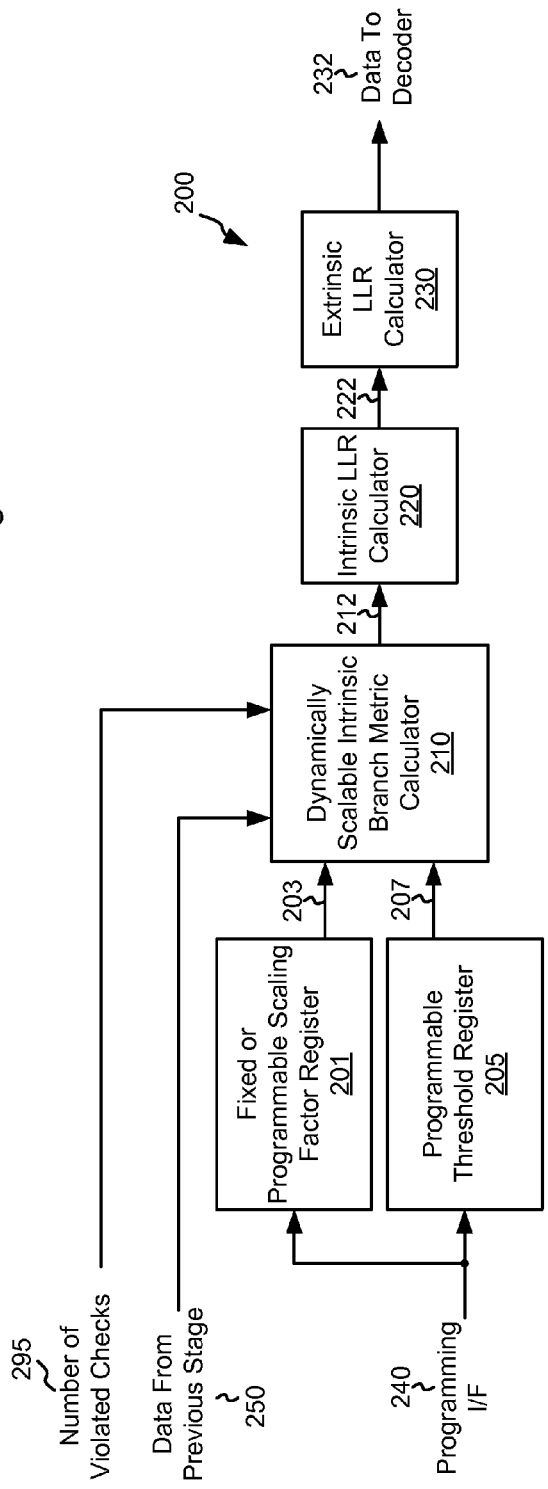

SYSTEMS AND METHODS FOR DATA DETECTION INCLUDING DYNAMIC SCALING

BACKGROUND OF THE INVENTION

The present inventions are related to systems and methods for detecting data in an incoming data stream, and more particularly to systems and methods for performing dynamic scaling as part of a detection process.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode process may be performed, however, such a simple process often lacks the capability to converge on a corrected data stream.

To heighten the possibility of convergence, various existing processes utilize two or more detection and decode iterations. Turning to FIG. 1, an exemplary prior art two stage data detection and decode circuit 100 is depicted. Two stage data detection and decode circuit 100 receives a data input 105 that is applied to a detector 110. A hard and soft output from detector 110 is provided to an LDPC decoder 115. Input 105 is fed forward via a buffer 130 to another detector 120. Detector 120 uses a soft output of LDPC decoder 115 and input 105 to perform an additional data detection process. A hard and soft output from detector 120 is provided to an LDPC decoder 125 that performs a second decoding process and provides an output 135. Where the initial detection and decode provided by detector 110 and LDPC decoder 115 does not converge, the subsequent detection and decode provided by detector 120 and LDPC decoder 125 provide an additional opportunity to converge. In these systems, various scalars are designed into the systems to massage data between various stages of the process. These scalars are either fixed at design time or are programmable static values that can be adjusted once the system is deployed in a storage medium. In some cases, however, data from one stage to another stage saturates limiting the capability of the system.

Hence, for at least the aforementioned reasons, there exists a need in the art for advanced systems and methods for data processing.

BRIEF SUMMARY OF THE INVENTION

The present inventions are related to systems and methods for detecting data in an incoming data stream, and more particularly to systems and methods for performing dynamic scaling as part of a detection process.

Various embodiments of the present invention provide data processing systems that include a channel detector circuit. The channel detector circuit includes a branch metric calculator circuit that is operable to receive a number of violated checks from a preceding stage, and to scale an intrinsic branch metric using a scalar selected based at least in part on the number of violated checks to yield a scaled intrinsic branch metric. In some instances of the aforementioned embodiments, the preceding stage is a decoder circuit. This decoder circuit provides the number of violated checks that correspond to a number of inaccurate outputs provided by the decoder circuit. In various instances, the decoder circuit is further operable to provide a soft output to the channel detector circuit. In a particular instance, the decoder circuit is operable to receive an output from the channel detector circuit. In such an instance, the soft output and the number of violated checks are determined based at least in part on the output from the channel detector circuit.

In various instances of the aforementioned embodiments, the scalar is selected as a first value when the number of violated checks is less than a threshold value, and is selected as a second value when the number of violated checks is not less than the threshold value. In some such instances, the threshold value is programmable. In various such instances, the first value is less than unity, and the second value is unity. In particular cases, one or both of the first value and the second value is/are programmable.

In some instances of the aforementioned embodiments, the channel detector circuit further includes an intrinsic LLR calculator circuit that is operable to receive the scaled intrinsic branch metric and to calculate an intrinsic LLR output, and an extrinsic LLR calculator circuit that is operable to receive the intrinsic LLR output and to calculate an extrinsic output.

Other embodiments of the present invention provide methods for dynamically scaling an intrinsic branch metric. Such methods include receiving a number of violated checks from a preceding stage; determining whether the number of violated checks is less than a threshold value; calculating an intrinsic branch metric; and scaling the intrinsic branch metric using a scaling value selected based at least in part upon whether the number of violated checks is less than the threshold value. In some instances of the aforementioned embodiments, a first scaling value is selected when the number of violated checks is less than the threshold value, and a second scaling value is selected when the number of violated checks is not less than the threshold value. In one or more cases, the first value is less than unity, and wherein the second value is unity. In other instances either or both of the first value and the second value are programmable.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2 depicts a data detection and decoding circuit including a channel detector circuit with dynamic scaling of an intrinsic branch metric output in accordance with some embodiments of the present invention;

FIG. 4 is a block diagram of a channel detector circuit with dynamic scaling of an intrinsic branch metric output in accordance with one or more embodiments of the present invention;

DETAILED DESCRIPTION OF THE INVENTION

Figure 1:
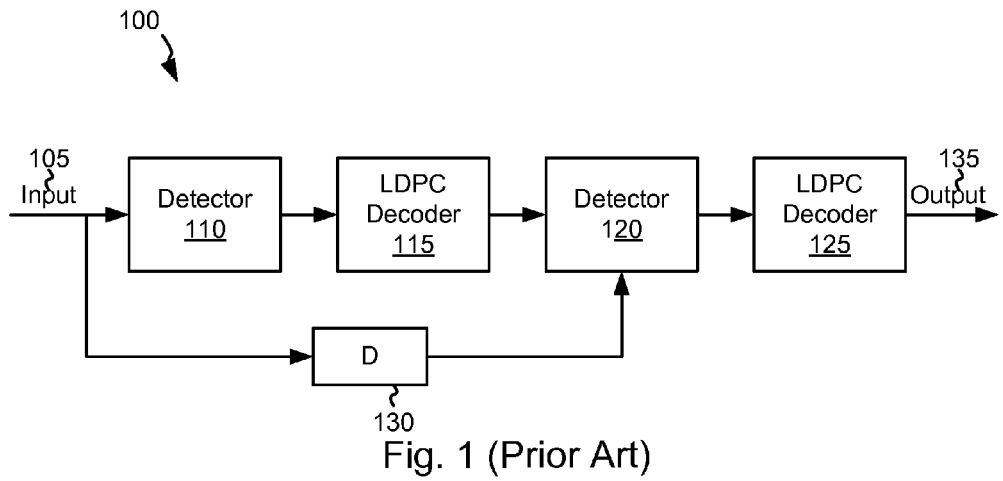
FIG. 1 depicts a prior art two stage data detection and decoding system.

The present inventions are related to systems and methods for detecting data in an incoming data stream, and more particularly to systems and methods for performing dynamic scaling as part of a detection process.

Various embodiments of the present invention provide compact hardware solutions for decoding suitable for read channel, wireless transmission and other applications. Such decoding/detection circuitry includes a channel detector (i.e., a data detector) circuit with an ability to dynamically scale an intrinsic branch metric output depending upon varying conditions. For example, one embodiment of the present invention provides a channel detector circuit that allows for scaling an intrinsic branch metric output using one scaling factor whenever a number of violated checks is less than a programmable threshold value, and scaling the intrinsic branch metric output using another scaling factor whenever the number of violated checks is not less than the programmable threshold value. As one advantage, such an approach may be used to reduce saturation, and thereby increase the probability that the data detection circuitry along with other data processing circuitry will converge on the desired result. Saturation is the number of soft decisions provided by the channel detector circuit that are equal to or exceed a maximum.

Turning to FIG. 2, a data detection and decoding circuit 260 is shown that includes a channel detector circuit 280 with dynamic scaling of an intrinsic branch metric output in accordance with some embodiments of the present invention. Data detection and decoding circuit 260 includes an input buffer 270 that receives an input 265. Input 265 is a series of digital samples that may be, for example, received from a storage medium or transferred across a communication medium via one or more input processing circuits. Input buffer 270 may be any storage device or circuit known in the art that is capable of storing at least one digital sample of input 265. In one embodiment of the present invention, an output 272 from input buffer 270 is provided to channel detector 280 as each sample of input 265 becomes available.

Channel detector 280 includes integrated dynamic scaling circuitry that scales signals being processed as part of the detection process in accordance with some embodiments of the present invention. Channel detector 280 may be any type of channel detector known in the art including, but not limited to, a soft output Viterbi algorithm detector (SOVA) or a maximum a posteriori (MAP) detector that is augmented to include dynamic scaling of an intrinsic branch metric. One implementation of channel detector 280 including integrated dynamic scaling circuitry is discussed below in relation to FIG. 4 and FIG. 5. In some cases, the dynamic scaling of channel detector 280 is performed similar to that described in relation to FIG. 6. Channel detector 280 is operable to perform a data detection on the series of received samples (i.e., output 272) to yield a detected output 282. The data detection includes application of dynamic scaling to internal calculations of channel detector 280. Detected output 282 is provided to a low density parity check (LDPC) decoder 290.

LDPC decoder 290 applies an LDPC decoding algorithm to detected output 282 to yield a first LDPC decoder output 292, a second LDPC decoder output 295 and a third LDPC decoder output 297. In one particular embodiment of the present invention, each of the first LDPC decoder output 292, the second LDPC decoder output 295 and the third LDPC decoder output 297 include soft data and hard data (together the data from the previous stage) where the soft data indicates the likelihood that the corresponding hard data has been accurately decoded or detected. In addition, the second LDPC decoder output 295 includes a number of violated checks that remain after the LDPC decoding of LDPC decoder 290 is applied. The number of violated checks indicates the number of bits that LDPC decoder 290 was incapable of determining the appropriate value. Where LDPC decoder 290 fails to converge, it is determined whether another iteration (i.e., a local iteration) of the LDPC decoder is to be applied. In such a case, the soft output included as part of the third LDPC decoder output 297 is used to re-process the series of digital samples again. Determination of whether another local iteration is desired may be done using any approach known in the art. Alternatively, where LDPC decoder 290 fails to converge and it is determined that another iteration (i.e., a global iteration) of channel detector 280 and LDPC decoder 290 is to be applied, the soft output included as part of the second LDPC decoder output 295 is provided to channel detector 280 where the soft output is used to re-process the series of digital samples again. The reprocessed output from channel detector 280 is provided to LDPC decoder 290 where it is reprocessed as part of the global iteration. Alternatively, where LDPC decoder 290 converges or where LDPC decoder 290 times out, the first LDPC decoder output 292 is provided to an output buffer 298 where it is buffered and provided as an output 299. Determination of whether another global iteration is desired may be done using any approach known in the art.

Figure 3:
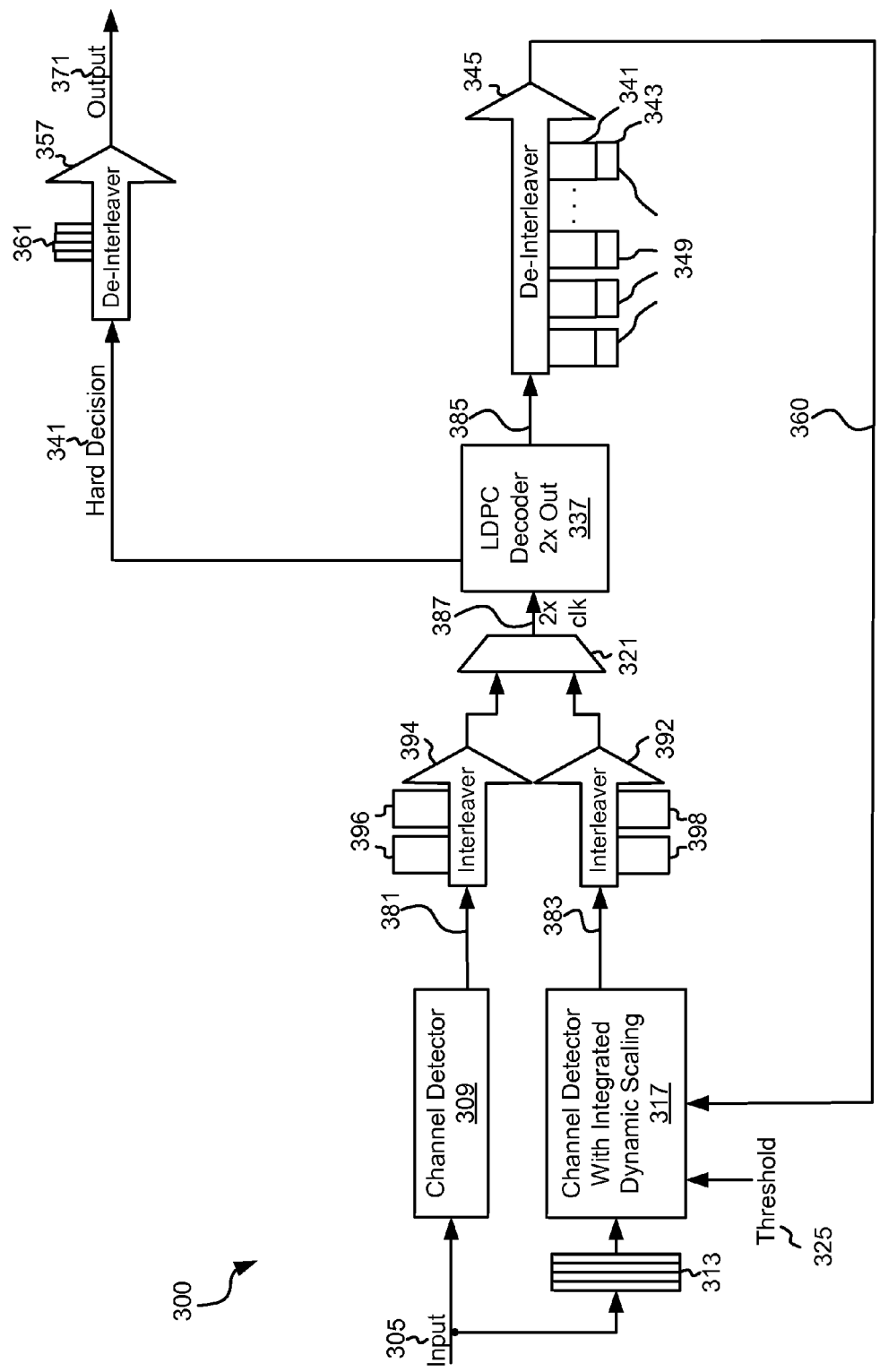
FIG. 3 shows a queuing detection and decoding circuit including a channel detector circuit with dynamic scaling of an intrinsic branch metric output in accordance with various embodiments of the present invention.

Turning to FIG. 3, a queuing detection and decoding circuit 300 including dynamic scalars is shown in accordance with various embodiments of the present invention. Queuing detection and decoding circuit 300 includes a data input 305 that is fed to a channel detector 309. In some embodiments, data input 305 may be derived from a storage medium. In particular cases, data input 305 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 305 is provided to a memory buffer 313 that is designed to hold a number of data sets received from data input 305. The size of memory buffer 313 may be selected to provide sufficient buffering such that a data set provided via data input 305 remains available at least until a first iteration processing of that same data set is complete and the processed data is available in a queue buffer 349 as more fully described below. Memory buffer 313 provides the data sets to a channel detector 317. Channel detector 317 includes dynamic scaling of an intrinsic branch metric in accordance with various embodiments of the present invention. Similar to channel detector 309, channel detector 317 may be any type of channel detector known in the art that is capable of modification to include dynamic scaling of the intrinsic branch metric. Based on the disclosure provided herein, one of ordinary skill in the art will recognize a variety of channel detectors that may be used in accordance with different embodiments of the present invention.

An output 381 of channel detector 309 is provided to an interleaver circuit 394. An output 383 of channel detector 317 is provided to another interleaver circuit 392. Interleaver circuit 394 interleaves the output of channel detector 309 using a ping pong buffer 396, and interleaver circuit 392 interleaves the output of channel detector 317 using a ping pong buffer 398. One of the buffers in ping pong buffer 396 holds the result of a prior interleaving process of the output from channel detector 309 and is unloaded to an LDPC decoder 337 via a multiplexer 321, while the other buffer of ping pong buffer 396 holds a data set from channel detector 309 that is currently being interleaved. Similarly, one of the buffers in ping pong buffer 398 holds the result of a prior interleaving process of the output from channel detector 317 and is unloaded to LDPC decoder 337 via a multiplexer 321, while the other buffer of ping pong buffer 398 holds a data set from channel detector 317 that is currently being interleaved. It should be noted that other soft decision data decoders may be used in place of LDPC decoder 337 in different embodiments of the present invention.

LDPC decoder 337 is capable of decoding one or more data sets simultaneously. As an example, LDPC decoder 337 may be designed to decode an interleaved data set from ping pong buffer 396, to decode an interleaved data set from ping pong buffer 398, or to decode interleaved data sets from ping pong buffer 396 and ping pong buffer 398 simultaneously. The decoded data is either provided as a hard decision output 341 or to a de-interleaver circuit 345 that uses queue buffer 349 to de-interleave the decoded data and to store the de-interleaved data until channel detector 317 is available for further processing. In particular, a data output 360 is provided from de-interleaver circuit 345 to channel detector 317. Data output 360 includes soft data and hard data (together the data from the previous stage) where the soft data indicates the likelihood that the corresponding hard data has been accurately decoded or detected. In addition, output 360 includes a number of violated checks that remain after the LDPC decoding of LDPC decoder 337 is applied. The number of violated checks indicates the number of bits that LDPC decoder 337 was incapable of determining the appropriate value.

One of the buffers in queue buffer 349 holds the result of a prior de-interleaving process and is unloaded to channel detector 317 (i.e., data from the previous stage and the number of violated checks), while another buffer of queue buffer 349 holds a decoded data set currently being de-interleaved, and one or more other buffers in queue buffer 349 maintain other non-converged data waiting for processing by channel detector 317. Non-converged data from queue buffer 349 is de-interleaved by de-interleaver 345 and passed to channel detector 317 that has access to the corresponding data set in memory buffer 313. The data detection performed by channel detector 317 is similar to that performed by channel detector 309 except that the intrinsic branch metric may be scaled depending upon the number of violated checks existing in the output from de-interleaver 345. The number of violated checks is compared with a threshold 325. Alternatively, where a data set converges in LDPC decoder 337, the data set is provided as hard decision output 341 to a de-interleaver circuit 357 that de-interleaves the received hard decision output 341 and stores the de-interleaved result in one of a number of memory buffers 361. Ultimately, de-interleaver circuit 357 provides the de-interleaved data stored in memory buffers 361 as an output 371.

Turning to FIG. 4, a block diagram of a channel detector circuit 200 with dynamic scaling of an intrinsic branch metric output is shown in accordance with one or more embodiments of the present invention. Channel detector circuit 200 includes a fixed or programmable scaling factor register 201. A dynamic scaling factor may be either hard wired in register 201, or may be programmably written to register 201 via a programming interface 240. Programming interface 240 may be any interface known in the art that is capable of writing information to a register. Register 201 provides a scaling factor 203 to an intrinsic branch metric calculator 210. Programming interface 240 is also capable of programming a threshold value into a programmable threshold register 205. Register 205 provides a threshold value 207 to intrinsic branch metric calculator 210. Intrinsic branch metric calculator circuit 210 also receives a number of violated checks 295 and data from a previous stage 250. In some cases, the previous stage is a decoder circuit.

Intrinsic branch metric calculator circuit 210 uses the various inputs to calculate an intrinsic branch metric and apply dynamic scaling thereto depending upon the number of violated checks 295. In particular, intrinsic branch metric calculator circuit 210 uses data from the previous stage 250 to calculate an internal branch metric. The data from the previous stage 250 includes soft data that may be used in relation to the originally processed data to increase the likelihood of convergence in a subsequent process. In addition, depending upon the number of violated checks 295, the calculated branch metric is dynamically scaled. In one particular embodiment of the present invention, intrinsic branch metric calculator circuit 210 provides an intrinsic branch metric output 212 in accordance with the following equation:

$$\text{Intrinsic Branch Metric Output } 212 = \left[\frac{(f \otimes y - \text{EdgeIdeal})^2}{\text{NoiseVariance}}\right]\eta,$$

where $\eta$ is a dynamic scaling factor. $\eta$ is dynamically selected depending upon the number of violated checks 295. In particular, where the number of violated checks 295 is less than threshold 207, the value of $\eta$ is selected as scaling factor 203. In contrast, where the number of violated checks is not less than threshold 207, the value of $\eta$ is selected as a hardwired value. In one particular embodiment of the present invention, the hardwired value is unity, and scaling factor 203 is programmed as 0.5. It should be noted that in different embodiments of the present invention that different values for the hardwired value and scaling factor 203 may be used. Further, in some cases, the hardwired value may be programmably changeable in different embodiments of the present invention.

Intrinsic branch metric output 212 is provided to an intrinsic log likelihood ratio (LLR) calculator circuit 220 as is known in the art. Intrinsic LLR calculator circuit 220 provides an intrinsic LLR output 222 to an extrinsic LLR calculator circuit 230. In one embodiment of the present invention, intrinsic LLR output 222 is calculated in accordance with the following equation:

$$\text{Intrinsic LLR Output } 222 = \left[\frac{(f \otimes y - EdgeIdeal)^2}{NoiseVariance}\right]\eta + LLR*\sin(x)/2.$$

Extrinsic LLR calculator circuit 230 may be any extrinsic LLR calculator circuit known in the art. Extrinsic LLR calculator circuit 230 performs an extrinsic LLR calculation on the received intrinsic LLR output 222 and provides an output 232 to a downstream decoder circuit. In one particular embodiment of the present invention, output 232 is a function of intrinsic LLR output 222 as set forth in the following equation:

$$\text{Output } 232 = \text{function}\left(\left[\frac{(f \otimes y - EdgeIdeal)^2}{NoiseVariance}\right]\eta + LLR*\sin(x)/2\right).$$

Figure 5:
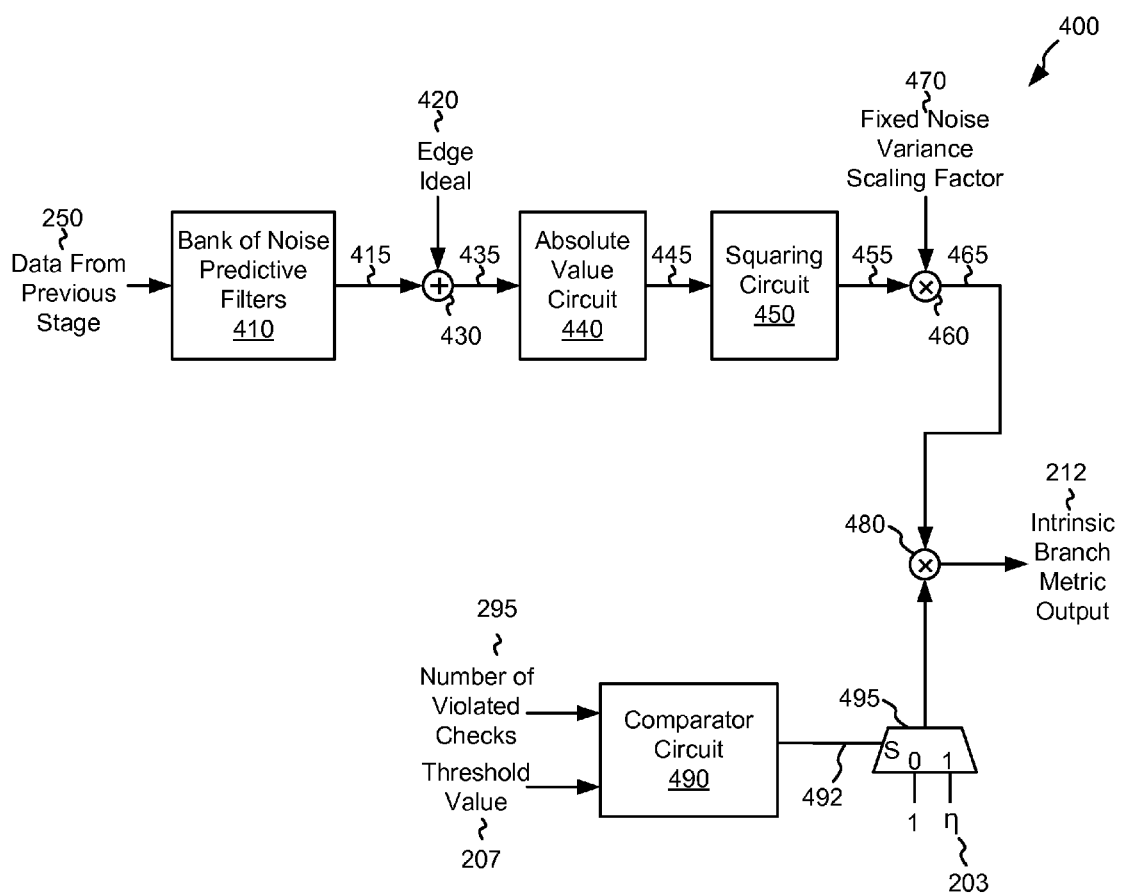
FIG. 5 shows a dynamically scalable intrinsic branch metric calculator circuit in accordance with various embodiments of the present invention.

Turning to FIG. 5, an intrinsic branch metric calculator circuit 400 including dynamic scaling in accordance with various embodiments of the present invention. Intrinsic branch metric calculator circuit 400 may be used in place of intrinsic branch metric calculator circuit 210 of FIG. 4. Intrinsic branch metric calculator circuit 400 receives data from a previous stage 250, the number of violated checks 295, scaling factor 203, and threshold value 207. Intrinsic branch metric calculator circuit 400 includes a bank of noise predictive filters 410 that provide a filtered output 415. The bank of noise predictive filters 410 may be any bank of noise predictive filters known in the art. In one particular embodiment of the present invention, the bank of noise predictive filters 410 includes a number of finite impulse response filters that are each tuned to a different noise predictive input (i.e., via taps). Based upon the disclosure provided herein, one of ordinary skill in the art will recognize other noise predictive filters that may be used in relation to different embodiments of the present invention.

Filtered output 415 is provided to a summation circuit 430 that sums filtered output 415 with an edge ideal value 420 to yield a sum 435. Sum 435 may be represented by the following equation:

Sum $435 = f \otimes y - $EdgeIdeal.

Sum 435 is provided to an absolute value circuit 440 that yields an absolute value output 445 which is provided to a squaring circuit 450. Squaring circuit 450 squares the received input to yield a squared output in accordance with the following equation:

Squared Output $455 = (f \otimes y - $EdgeIdeal$)^2$.

Squared output 455 is multiplied by a fixed noise variance scaling factor 470 using a multiplication circuit 460. The fixed noise variance scaling may be any value selected to represent the estimated noise variance. For example, in some embodiments of the present invention the fixed noise variance is selected as eight (8). A product 465 of the multiplication is provided to another multiplication circuit 480. The following equation describes product 465:

$$\text{Product } 465 = \frac{(f \otimes y - EdgeIdeal)^2}{NoiseVariance}.$$

Multiplication circuit 480 provides intrinsic branch metric output 212.

A comparator circuit 490 compares the number of violated checks 295 with threshold value 207. Where the number of violated checks 295 is less than threshold value 207, comparator circuit 490 asserts a comparator output 492 as a logic '1'. In contrast, where the number of violated checks is not less than threshold value 207, comparator circuit 490 asserts comparator output 492 as a logic '0'. Comparator output 492 is applied to a select input of a multiplexer circuit 495. Multiplexer circuit 495 selects between a hardwired value of unity when comparator output 492 is a logic '0' and scaling factor 203 when comparator output 492 is a logic '1'. Depending upon the assertion level of comparator output 492, multiplication circuit 480 multiplies product 465 by either unity or scaling factor 203. Thus, intrinsic branch metric output 212 corresponds to the following pseudocode:

If(Comparator Output 492 is a logic '0'){

$$\text{Intrinsic Branch Metric Output } 212 = \frac{(f \otimes y - EdgeIdeal)^2}{NoiseVariance}$$

}

Else {

$$\text{Intrinsic Branch Metric Output } 212 = \eta\left[\frac{(f \otimes y - EdgeIdeal)^2}{NoiseVariance}\right]$$

}.

Figure 6:
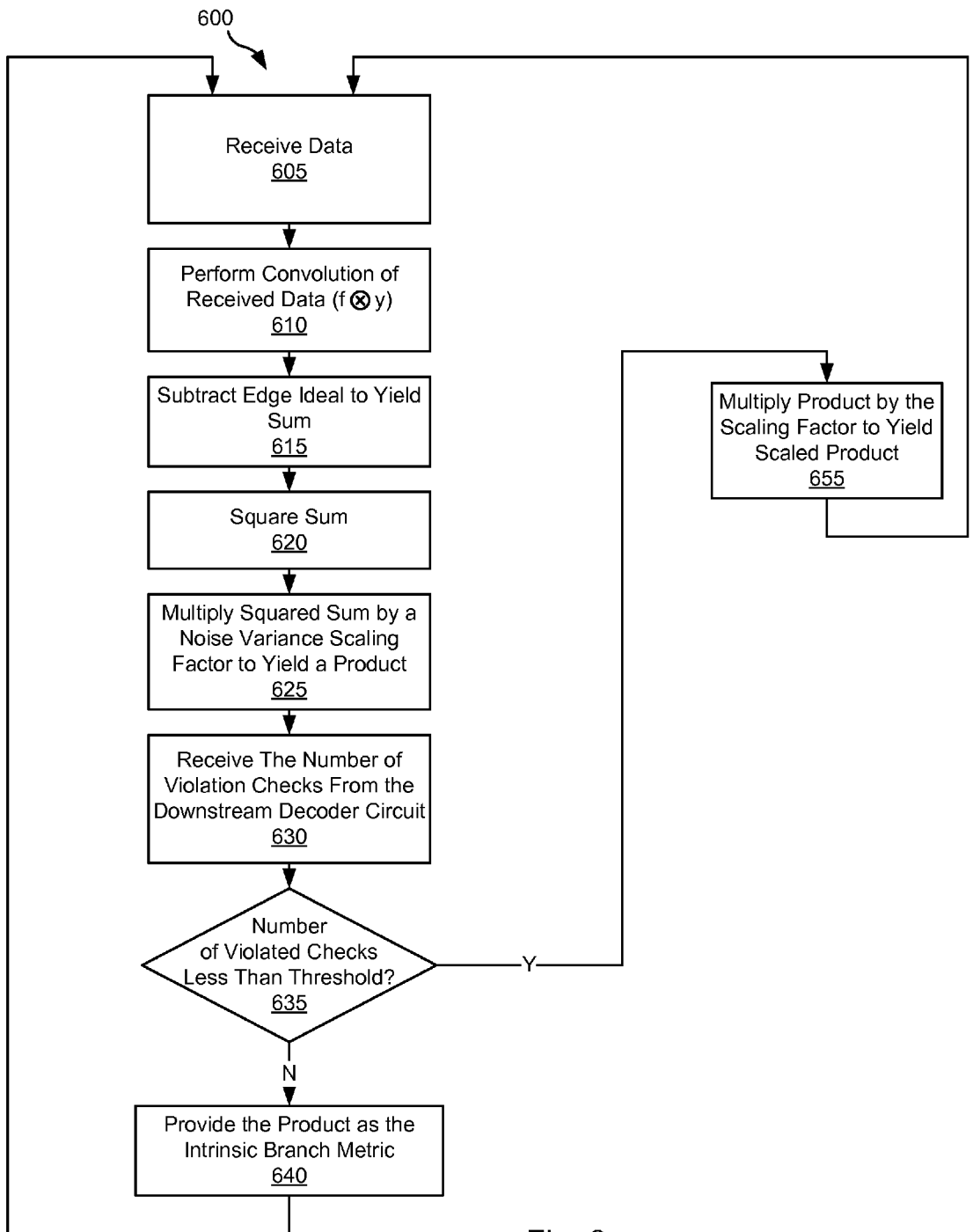
FIG. 6 is a flow diagram showing a method in accordance with some embodiments of the present invention for performing dynamic scaling of an intrinsic branch metric.

Turning to FIG. 6, a flow diagram 600 shows a method in accordance with some embodiments of the present invention for performing dynamic scaling of an intrinsic branch metric. Following flow diagram 600, data is received from a downstream decoder circuit (block 605). In some cases, the received data includes soft data indicating the likelihood that respective bits have been accurately predicted. A convolution is performed on the received data (y) (block 610). The convolution may include applying noise predictive filtering to the received data in accordance with the following equation:

Output$=f \otimes y$.

An edge ideal is then subtracted from the preceding output to yield a sum (block 615). The sum is described by the following equation:

Sum$=f \otimes y - $EdgeIdeal.

This sum is squared (block 620) to yield a squared output in accordance with the following equation:

Squared Sum$=(f \otimes y - $EdgeIdeal$)^2$.

The squared sum is then multiplied by a noise variance scaling factor to yield a product (block 625). The product is described by the following equation:

$$\text{Product} = \frac{(f \otimes y - EdgeIdeal)^2}{NoiseVariance}.$$

Again, it should be noted that the fixed noise variance scaling may be any value selected to represent the estimated noise variance. For example, in some embodiments of the present invention the fixed noise variance is selected as eight (8).

The number of violated checks from a previous stage such as a decoder circuit are received (block 630). As previously described, the number of violated checks indicates the number of bits that were not properly resolved by the preceding stage. It is determined whether the number of violated checks is less than a threshold value (block 635). Where the number of violated checks is not less than the threshold value (block 635), the aforementioned product is provided as the intrinsic branch metric output (block 640). Alternatively, where the number of violated checks is less than the threshold value (block 635), the aforementioned product is multiplied by a scaling factor to yield a scaled product (block 655). Multiplication by the scaling factor results in the following scaled product:

$$\text{Scaled Product} = \frac{(f \otimes y - EdgeIdeal)^2}{NoiseVariance} \eta.$$

It should be noted that the systems, circuits and methods described in relation to FIGS. 4-6 provide for dynamic selection between a unity scaling factor when the number of violated checks is not less than the threshold and scaling factor 203 when the number of violated checks is less than the threshold. Other embodiments of the present invention may provide for selection between three or more scaling factors. For example, in one particular embodiment of the present invention, a number of scaling factors (e.g., $\eta_1, \eta_2, \ldots \eta_n$) may be programmed and selectably used to dynamically scale the intrinsic branch metric depending upon the number of violated checks. In particular, a first scaling factor may be used where the number of violated checks is less than a first threshold, a second scaling factor may be used where the number of violated checks is not less than the first threshold and less than a second threshold, and a third scaling factor may be used where the number of violated checks is not less than the second threshold. Based upon the disclosure provided herein, one of ordinary skill in the art will recognize use of any desired number of thresholds and corresponding scaling factors. As another example, in some embodiments of the present invention, a number of scaling factors (e.g., $\eta_1, \eta_2, \ldots \eta_n$) may be programmed and selectably used to dynamically scale the intrinsic branch metric depending upon the number of violated checks and the number of global iterations. For example, on the first global iteration a first scaling factor may be selected where the number of violated checks is less than a threshold, and for a second global iteration a second scaling factor may be selected where the number of violated checks is less than the threshold.

Figure 7:
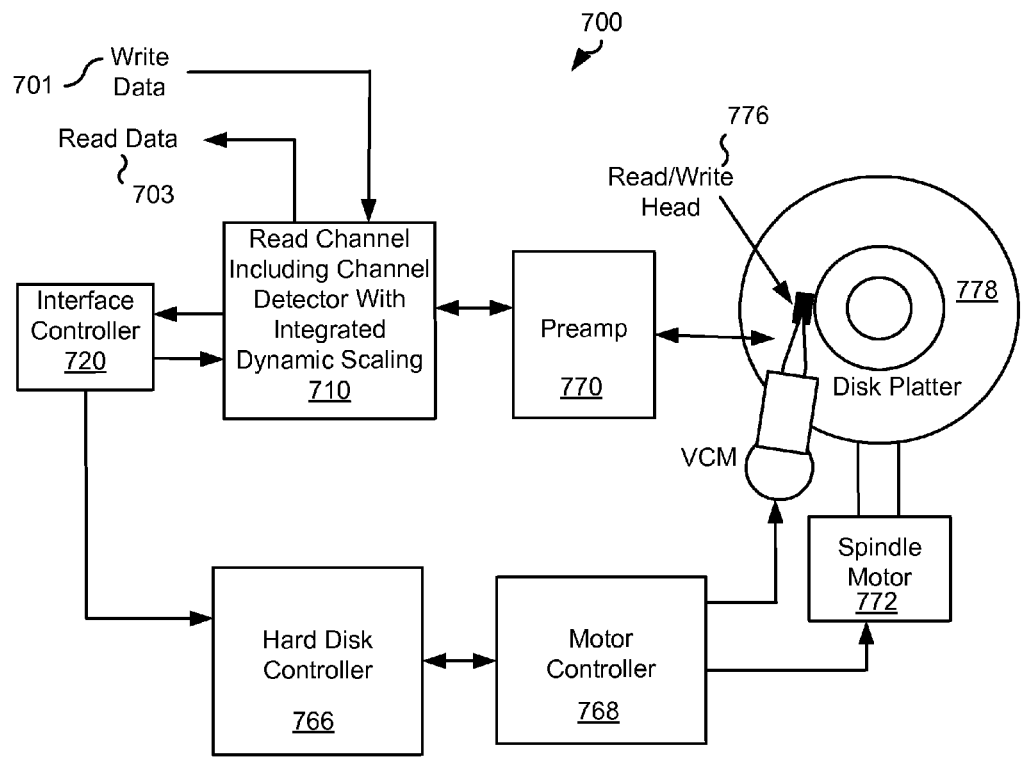
FIG. 7 shows a storage system including a channel detector with integrated dynamic scaling in accordance with various embodiments of the present invention.

Turning to FIG. 7, a storage system 700 including read channel circuit 710 with a channel detector circuit including integrated dynamic scaling is shown in accordance with various embodiments of the present invention. Storage system 700 may be, for example, a hard disk drive. Read channel circuit 710 may include, but is not limited to, a data processing circuit similar to those described above in relation to FIG. 2 or FIG. 3 that each include a channel detector circuit with integrated dynamic scaling. The channel detector circuit that is used may be similar to that discussed above in relation to FIG. 4 and FIG. 5, and/or may operate in accordance with the method discussed in relation to FIG. 6.

Storage system 700 also includes a preamplifier 770, an interface controller 720, a hard disk controller 766, a motor controller 768, a spindle motor 772, a disk platter 778, and a read/write head assembly 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with a perpendicular recording scheme. For example, the magnetic signals may be recorded as either longitudinal or perpendicular recorded signals.

In a typical read operation, read/write head assembly 776 is accurately positioned by motor controller 768 over a desired data track on disk platter 778. The appropriate data track is defined by an address received via interface controller 720. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel circuit 710 via preamplifier 770. Preamplifier 770 is operable to amplify the minute analog signals accessed from disk platter 778. In turn, read channel circuit 710 decodes and digitizes the received analog signal to recreate the information originally written to disk platter 778. The decoding process includes hard decision assist which, in some cases, may limit the amount of processing required for convergence and in other cases may allow convergence that otherwise would not be possible. The read data is provided as read data 703. A write operation is substantially the opposite of the preceding read operation with write data 701 being provided to read channel module 710. This data is then encoded and written to disk platter 778.

In conclusion, the invention provides novel systems, devices, methods and arrangements for performing data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:
1. A data processing system, the system comprising:
 a channel detector circuit, the channel detector circuit including:
  a branch metric calculator circuit operable:
   to receive a number of violated checks from a preceding stage, and
   to scale an intrinsic branch metric using a scalar selected based at least in part on the number of violated checks to yield a scaled intrinsic branch metric; and an intrinsic LLR calculator circuit operable to receive the scaled intrinsic branch metric and to calculate an intrinsic LLR output.

2. The system of claim 1, wherein the preceding stage is a decoder circuit, and wherein the number of violated checks corresponds to a number of inaccurate outputs provided by the decoder circuit.

3. The system of claim 1, wherein the scalar is selected as a first value when the number of violated checks is less than a threshold value, and wherein the scalar is selected as a second value when the number of violated checks is not less than the threshold value.

4. The system of claim 3, wherein the threshold value is programmable.

5. The system of claim 3, wherein the first value is less than unity, and wherein the second value is unity.

6. The system of claim 3, wherein the first value is programmable.

7. The system of claim 3, wherein the second value is programmable.

8. The system of claim 1, wherein the channel detector circuit further includes:
an extrinsic LLR calculator circuit operable to receive the intrinsic LLR output and to calculate an extrinsic output.

9. The system of claim 1, wherein the system further comprises a decoder circuit, and wherein the decoder circuit is operable to provide a soft output and the number of violated checks to the channel detector circuit.

10. The system of claim 9, wherein the decoder circuit is operable to receive an output from the channel detector circuit, and wherein the soft output and the number of violated checks are determined based at least in part on the output from the channel detector circuit.

11. The data processing system of claim 1, wherein the data processing system is implement as part of a storage device.

12. The data processing system of claim 1, wherein the data processing system is implemented as part of an integrated circuit.

13. A method for dynamically scaling an intrinsic branch metric, the method comprising:
receiving a number of violated checks from a preceding stage;
determining whether the number of violated checks is less than a threshold value;
calculating an intrinsic branch metric; scaling the intrinsic branch metric using a scaling value selected based at least in part upon whether the number of violated checks is less than the threshold value; and
wherein a first value less than unity is selected when the number of violated checks is less than the threshold value, and a second value is selected when the number of violated checks is greater than the threshold value.

14. The system of claim 13, wherein the first value is programmable.

15. The method of claim 13, wherein the threshold value is programmable.

16. The method of claim 13, wherein the second value is unity.

17. A storage system, the storage system comprising:
a storage medium;
a read channel circuit, wherein the read channel circuit is operable to receive data derived from the storage medium, and wherein the read channel circuit includes:
a channel detector circuit, wherein the channel detector circuit includes:
a branch metric calculator circuit, wherein the branch metric calculator circuit is operable to receive a number of violated checks from a preceding stage, and wherein the branch metric calculator circuit is further operable to scale an intrinsic branch metric using a scalar selected based at least in part on the number of violated checks to yield a scaled intrinsic branch metric; and
an intrinsic LLR calculator circuit operable to receive the scaled intrinsic branch metric and to calculate an intrinsic LLR output.

18. The storage system of claim 17, wherein the preceding stage is a decoder circuit included in the read channel circuit, and wherein the decoder circuit is operable to provide a soft output and the number of violated checks to the channel detector circuit.

19. The storage system of claim 17, wherein the channel detector circuit further includes:
an extrinsic LLR calculator circuit operable to receive the intrinsic LLR output and to calculate an extrinsic output.

20. The storage system of claim 17, wherein the scalar is selected as a first value when the number of violated checks is less than a threshold value, wherein the scalar is selected as a second value when the number of violated checks is not less than the threshold value, and wherein the threshold value is programmable.

* * * * *